US008815477B2

(12) United States Patent (10) Patent No.: US 8,815,477 B2
Ikeda et al. (45) Date of Patent: Aug. 26, 2014

(54) COLOR FILTER MANUFACTURING METHOD, PATTERNED SUBSTRATE MANUFACTURING METHOD, AND SMALL PHOTOMASK

(75) Inventors: Takeshi Ikeda, Tokyo (JP); Eishi Aoki, Tokyo (JP); Genki Harada, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 572 days.

(21) Appl. No.: 12/926,433

(22) Filed: Nov. 17, 2010

(65) Prior Publication Data

US 2011/0070532 A1 Mar. 24, 2011

Related U.S. Application Data

(63) Continuation of application No. PCT/JP2009/058516, filed on Apr. 30, 2009.

(30) Foreign Application Priority Data

May 28, 2008 (JP) ................................ 2008-139163

(51) Int. Cl.
*G03F 7/20* (2006.01)
*G02B 5/20* (2006.01)

(52) U.S. Cl.
USPC ............................................... 430/7; 430/945

(58) Field of Classification Search
None
See application file for complete search history.

(56) References Cited

U.S. PATENT DOCUMENTS 8,216,750 B2 * 7/2012 Shigemori et al. ............... 430/7

FOREIGN PATENT DOCUMENTS

| JP | 6-347637 | 12/1994 |
| JP | 7-199465 | 8/1995 |
| JP | 2005-316166 | 11/2005 |
| JP | 2007-11231 | 1/2007 |
| JP | 2007-72371 | 3/2007 |
| JP | 2007-94061 | 4/2007 |
| JP | 2007-102094 | 4/2007 |
| JP | 2008-102241 | 5/2008 |
| JP | 2008-216798 | 9/2008 |
| JP | 2008-281919 | 11/2008 |
| JP | 2008-287213 | 11/2008 |
| JP | 2008-310164 | 12/2008 |
| JP | 2009-145432 | 7/2009 |
| TW | 200424598 | 11/2004 |

OTHER PUBLICATIONS

English language abstract of JP 2008-287213 (Nov. 2008).*
Computer-generated translation of JP 2008-287213 (Nov. 2008).*
Computer-generated translation of JP 2008-310164 (Dec. 2008).*
Computer-generated translation of JP 2008-102241 (May 2008).*
International Search Report for PCT/JP2009/058516 mailed Aug. 11, 2009.

(Continued)

*Primary Examiner* — John A. McPherson

(57) ABSTRACT

A color filter manufacturing method for forming a filter segment and a black matrix by repeating at least a coating step of coating a substrate with a photosensitive resin layer, a pattern exposure step of curing the photosensitive resin layer by pattern exposure, a developing step of developing the exposed photosensitive resin layer, and a sintering step of thermosetting the developed photosensitive resin layer, in this order a plurality of number of times, characterized in that in the exposure step, a laser is used as light source, and proximity exposure is performed by repetitively emitting the laser via photomask such that a cumulative exposure amount is 1 to 150 mJ/cm$^2$.

7 Claims, 2 Drawing Sheets

(56) References Cited

OTHER PUBLICATIONS

Japanese Notification of Reasons for Rejections mailed Jan. 29, 2013, issued in corresponding Japanese Patent Application No. 2010-514425.

Chinese Office Action mailed May 17, 2012 issued in corresponding Chinese Patent Application No. 200980119437.4.

Taiwanese Office Action mailed Nov. 27, 2013 in corresponding Taiwanese Application No. 098114321.

* cited by examiner

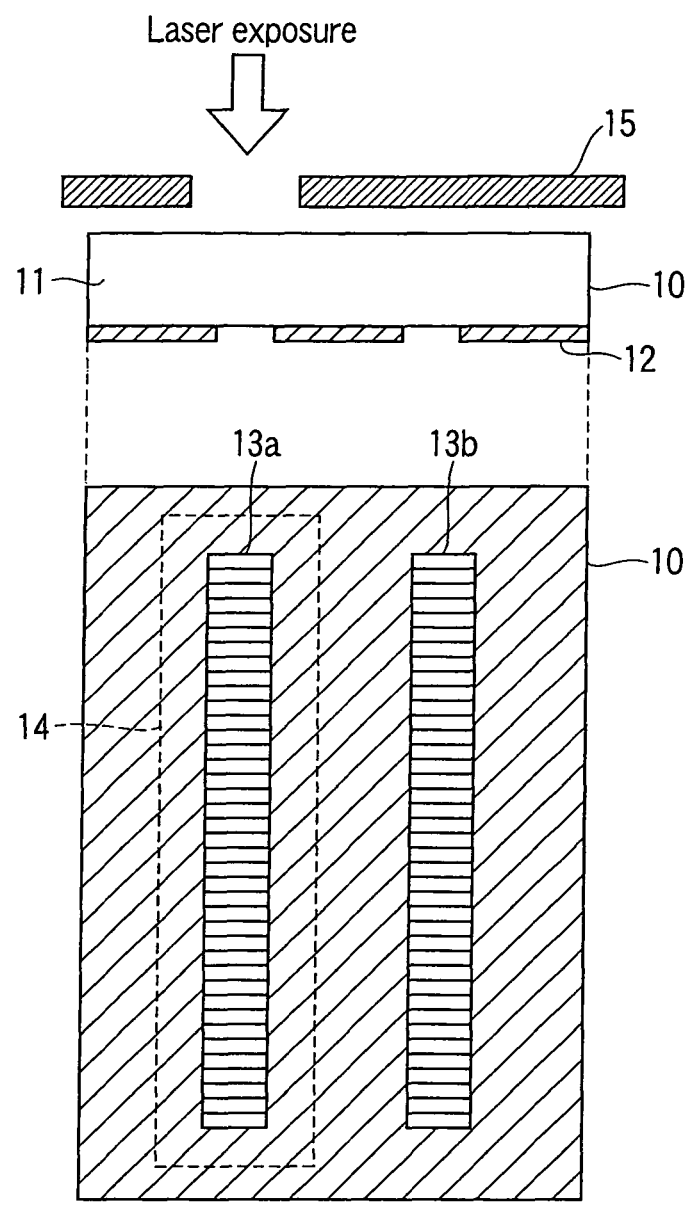
F I G. 2

COLOR FILTER MANUFACTURING METHOD, PATTERNED SUBSTRATE MANUFACTURING METHOD, AND SMALL PHOTOMASK

CROSS-REFERENCE TO RELATED APPLICATIONS

This is a Continuation application of PCT Application No. PCT/JP2009/058516, filed Apr. 30, 2009, which was published under PCT Article 21(2) in Japanese.

This application is based upon and claims the benefit of priority from prior Japanese Patent Application No. 2008-139163, filed May 28, 2008, the entire contents of which are incorporated herein by reference.

BACKGROUND OF THE INVENTION

1. Field of the Invention

The present invention relates to methods of manufacturing a color filter and patterned substrate for use in, e.g., a field emission display device, fluorescent display device, plasma display (PDP), and liquid crystal display device. The present invention particularly relates to a color filter manufacturing method using a plurality of small photomasks, a patterned substrate manufacturing method, and the small photomask.

2. Description of the Related Art

A color filter for use in a color liquid crystal display device or the like is an essential member of the color liquid crystal display device or the like, and has functions of improving the image quality of the liquid crystal display device and giving each pixel a corresponding primary color. A filter segment or black matrix forming this color filter is manufactured as follows. That is, after a glass substrate or the like is coated with a photosensitive material, the excess solvent is removed by drying. Subsequently, the photosensitive material is irradiated with an active energy line via a photomask for pixel formation by, e.g., proximity exposure using an ultra-high-pressure mercury lamp. Consequently, the portion irradiated with the energy is cured (negative type) or the alkali solubility is increased (positive type), thereby removing a portion to be dissolved by an alkali solution or the like. A color filter is manufactured by repeating this process for each color.

Recently, the color liquid crystal display devices have formed a large market of liquid crystal color television displays, car navigation displays, and notebook PCs integrated with liquid crystal displays. The color liquid crystal display devices are also widely used as desktop PC monitors and television monitors that offer energy- and space-saving features. With the spread of the color liquid crystal display devices in general markets, demands for improving the color reproduction characteristics are increasing.

Also, to increase the contrast, a black matrix is generally formed between filter segments of the individual colors of the color filter. Recently, to solve the environmental problems, decrease the reflection, and reduce the cost, a resin black matrix formed by dispersing a light-shielding dyestuff in a resin is attracting more attention than a chromium metal black matrix. However, the resin black matrix has the problem that the light-shielding performance (optical density) is lower than that of the chromium metal black matrix.

To improve the color reproduction characteristics of the color filter and the light-shielding performance of the black matrix, it is necessary to increase the content of a dyestuff in a photosensitive coloring composition or increase the film thickness. However, if the content of a dyestuff is increased in a conventional method such as proximity exposure by which ultraviolet light or the like from an ultra-high-pressure mercury lamp is used as an active energy source as a light source, the problems such as the decrease in sensitivity and the deterioration of the development properties and resolution arise. Also, if the film thickness is increased, the exposure light does not reach the bottom of the film, and this poses the problems that, e.g., the linearity and sectional shape of the filter segments and black matrix deteriorate. Note that in the description of the present invention, the filter segments refer to individual coloring pixels of red, green, and blue, and the black matrix refers to a light-shielding black thin-line pattern for dividing these filter segments. Note also that light (a laser beam) from a laser as an exposure light source will simply be referred to as a laser hereinafter.

On the other hand, with the spread of the color liquid crystal display devices, demands for reducing the cost of the color filter are increasing. In the above-mentioned proximity exposure method, an ultra-high-pressure mercury lamp is generally used as a light source, and illuminating light whose illumination unevenness is eliminated by a fly-eye lens or microlens is converted into parallel light by a collimator lens. A photomask and a substrate on which a photosensitive resin layer such as a color resist is formed are arranged with a spacing of a few ten μm to a few hundred μm. The parallel light is emitted from above the photomask, thereby transferring the pattern of the photomask onto the substrate.

As described above, the proximity exposure method using an ultra-high-pressure mercury lamp requires no projecting exposure system. Since the apparatus configuration is very simple, the apparatus cost is low. Also, the same substrate area as the photomask can be exposed by one shot. Therefore, the method has the advantage that the tact is short when using a large photomask having almost the same size as that of the substrate. However, as the screen size of a product using the color filter increases, or to attach a number of large screens to one large-sized transparent substrate, the size of the photomask must further be increased. Since upsizing the photomask increases the manufacturing cost, it is important to reduce the cost of the photomask.

As a method of reducing the manufacturing cost of the photomask, patent reference 1 has disclosed a maskless exposure method that uses a laser as a light source and forms a two-dimensional image by relative scanning while modulating the light based on image data. Patent reference 2 has disclosed a laser exposure apparatus to be used to form the black matrix of the color filter. Since the laser exposure method can form pixels without using any expensive photomask, a large cost down can be expected. However, the laser exposure method using no photomask makes it difficult to develop a spatial modulation element to be used in exposure and a photosensitive resin composition suitable for the laser. In addition, fine patterns having good shapes are difficult to form. Furthermore, in the method described in patent reference 1, the exposure sensitivity must be increased by forming an oxygen-blocking film.

Patent reference 3 has disclosed an inkjet method capable of simultaneously printing three colors, i.e., R, G, and B by using coloring resin compositions of these colors as inks. Since the three colors can be printed at the same time, wastage of the materials is little. In addition, a reduction in environmental load and a large cost down can be expected because the pixel formation process is shortened. However, the inkjet method has the problem that a coloring layer printed by an ink ejector has not a flat shape but a projecting shape.

PRIOR ART REFERENCES

Patent References

Patent reference 1: Jpn. Pat. Appln. KOKAI Publication No. 2007-11231
Patent reference 2: Jpn. Pat. Appln. KOKAI Publication No. 2005-316166
Patent reference 3: Jpn. Pat. Appln. KOKAI Publication No. 6-347637

BRIEF SUMMARY OF THE INVENTION

Problems to be Solved by Invention

The present invention has been made to solve the above-mentioned problems, and has as its object to provide a color filter manufacturing method capable of forming filter segments and a black matrix superior in linearity and sectional shape and having a sufficient film thickness as a color filter, capable of downsizing an expensive photomask in order to reduce the cost of the photomask, and also capable of suppressing the decrease in productivity, and provide a patterned substrate manufacturing method and a small photomask.

The present invention also proposes a technique capable of setting an arbitrary exposure amount, thereby solving the problem that a photosensitive resin layer is insufficiently photocured owing to the wavelength of an exposure light source used or the sensitivity characteristics of the photosensitive resin layer and wrinkled by annealing in a post-process, and the problem that it is difficult to form structures having different heights as liquid crystal spacers by performing pattern exposure once.

Means for Solving the Problems

According to the extensive studies made by the present inventor, a photomask can be downsized by performing proximity exposure via a photomask for pixel formation by using a laser as a light source. It is also possible to suppress the decomposition of a photosensitive resin coating film caused by the abrasion phenomenon and form filter segments having a sufficient film thickness, by performing exposure such that the cumulative exposure amount is 1 to 150 mJ/cm$^2$. The present invention has been made based on these findings.

A first aspect of the present invention is a color filter manufacturing method for forming a filter segment and a black matrix by repeating at least: (a) a coating step of coating a substrate with a photosensitive resin layer made of a photosensitive resin composition; (b) a pattern exposure step of curing the photosensitive resin layer on the substrate by pattern exposure; (c) a developing step of removing an unexposed (uncured) portion of the photosensitive resin layer by developing the exposed photosensitive resin layer; and (d) a sintering step of thermosetting the developed photosensitive resin layer, in this order a plurality of number of times, characterized in that in the exposure step (b), a laser is used as a light source, a plurality of photomasks each having a pattern region smaller than a whole exposure region on the substrate are used as photomasks for pixel formation, and proximity exposure is performed by repetitively emitting the laser a plurality of number of times via the photomasks such that a cumulative exposure amount is 1 to 150 mJ/cm$^2$.

According to the second aspect of the present invention, in the color filter manufacturing method according to the first aspect mentioned above, a frequency of the laser is 1 to 500 Hz.

According to a third aspect of the present invention, in the color filter manufacturing method according to the first aspect mentioned above an energy density per pulse of the laser is 0.1 to 1,000 mJ/cm$^2$, and a pulse width is 0.1 to 3,000 nsec.

According to a fourth aspect of the present invention, in the color filter manufacturing method according to the first aspect mentioned above in the exposure step (b), the photosensitive resin layer is photocured by emitting the laser such that the cumulative exposure amount is 1 to 50 mJ/cm$^2$.

According to a fifth aspect of the present invention, in the color filter manufacturing method according to the first aspect mentioned above a molar absorption coefficient ($\epsilon$308) at 308 nm of a photopolymerization initiator used in the photosensitive resin composition is larger than a molar absorption coefficient ($\epsilon$365) at 365 nm.

According to a sixth aspect of the present invention, in the color filter manufacturing method according to the first aspect mentioned above a ratio (I/M) of a mass (I) of a photopolymerization initiator to a mass (M) of a monomer used in the photosensitive resin composition is 0.01 to 0.45.

A seventh aspect of the present invention is a patterned substrate manufacturing method comprising: (a) a coating step of coating a rectangular substrate with a photosensitive resin layer made of a photosensitive resin composition; and (b) a pattern exposure step of exposing the photosensitive resin layer on the substrate by pattern exposure while moving the substrate in a longitudinal direction, characterized in that in the exposure step (b), a laser is used as an exposure light source, a plurality of small photomasks for pattern formation are arranged in a widthwise direction of the substrate, and proximity exposure by which the same pattern is repetitively irradiated with the laser is performed.

According to an eighth aspect of the present invention, in the patterned substrate manufacturing method according to the seventh aspect mentioned above, the plurality of small photomasks arranged in the widthwise direction comprise two rows of the small photomasks arranged in a moving direction of the substrate.

According to a ninth aspect of the present invention, in the patterned substrate manufacturing method according to the seventh aspect mentioned above, the small photomask is obtained by forming not less than two different types of patterns in the same mask plane in a moving direction of the substrate, and one of the patterns is selectively exposed in accordance with the type.

Another aspect of the present invention is the patterned substrate manufacturing method according to the seventh aspect mentioned above, characterized in that the pattern exposure is performed by changing an exposure amount by changing the number of shots of exposure from the laser.

Another aspect of the present invention is a small photomask for use in a color filter manufacturing method according to the first aspect mentioned above, characterized in that not less than two different types of patterns are formed in the same mask plane.

Effects of Invention

In the present invention, a photosensitive resin composition is cured or exposed within a very short time by emitting a laser having a specific wavelength at a low output for a short time period. Therefore, filter segments and a black matrix superior in shape can be formed at a low cost by using a small photomask. Also, since a plurality of small photomasks are used together, patterns can be formed with high accuracy without decreasing the productivity. In particular, efficient laser exposure can be performed without decreasing the throughput by arranging a plurality of small photomasks along the widthwise direction of a large-sized rectangular transparent substrate (a substrate coated with a photosensitive resin). Furthermore, the technique of the present invention can largely reduce the cost of the photomask. Since small photomasks are arranged in the widthwise direction of the rectangular substrate, the number of small photomasks can be made smaller than that when arranging them in the longitudinal direction of the rectangular substrate.

In addition, since proximity exposure is performed such that the cumulative exposure amount is 1 to 150 mJ/cm$^2$, it is possible to suppress the decomposition and evaporation of a photosensitive resin layer caused by the abrasion phenomenon, and manufacture filter segments and a black matrix having a sufficient film thickness, or a patterned substrate including, e.g., TFTs. The techniques described in the present invention are applicable not only to the manufacture of a liquid crystal display substrate, but also to the manufacture of patterned substrates for, e.g., a plasma display, organic EL display substrate, printed circuit board, and solar cell.

Furthermore, when forming filter segments by using a photosensitive resin layer or forming a structure or the like on a color filter or on a substrate including TFT elements, the present invention has a large effect of forming the target filter segments or structure with a high degree of freedom by performing pattern exposure with different exposure amounts by changing the number of shots from a laser source. By performing divisional exposure by using a photo-alignable organic material, a liquid crystal alignment film pattern having a plurality of alignment regions can be formed. Alternatively, phase-difference patterns in which the retardation is controlled for each color can be formed by using a liquid crystal polymer whose retardation is adjustable by laser exposure. In the pattern exposure of a photosensitive resin layer containing a blue pigment as a coloring material, the problem of the formation of wrinkles caused by insufficient curing can be eliminated by increasing the number of shots of exposure from the laser source in a peripheral portion of the effective screen or on the end face of the substrate. Similarly, spacers having different heights for adjusting the gap between liquid crystal cells can be formed by adjusting the number of shots of exposure from the laser source.

BRIEF DESCRIPTION OF THE SEVERAL VIEWS OF THE DRAWING

FIG. 2 includes a plan view and sectional view showing the arrangement of one photomask.

DETAILED DESCRIPTION OF THE INVENTION

Figure 1:
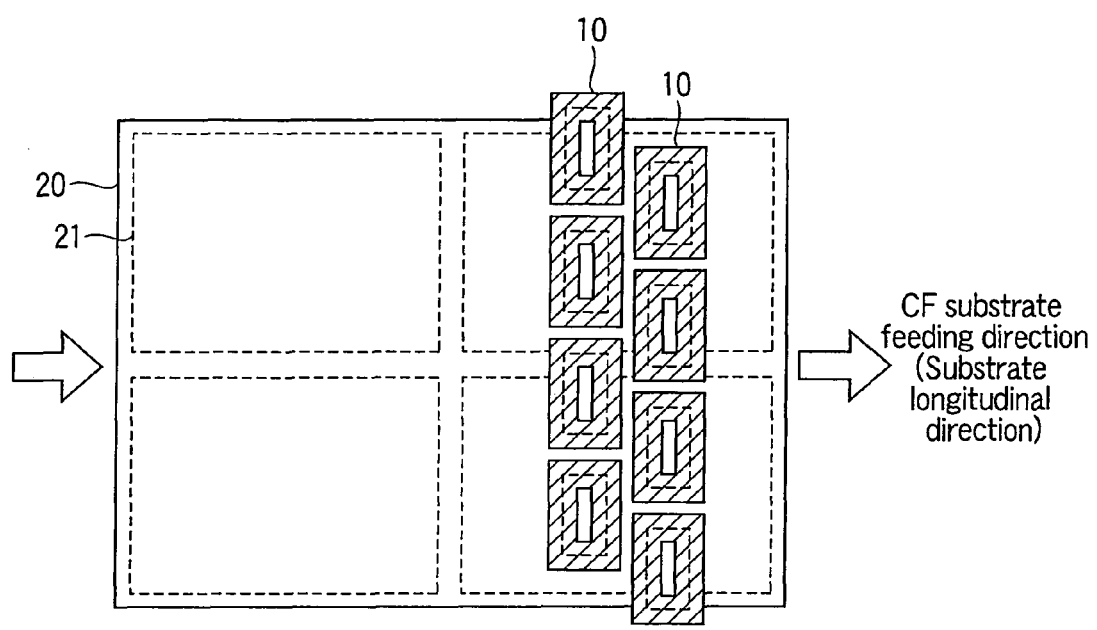
FIG. 1 is a plan view showing the way CF patterns are exposed by using a plurality of small photomasks.

A color filter manufacturing method of the present invention is characterized by repeating, for each color, the step of coating a substrate with a photosensitive resin composition, the step of curing a prospective filter segment portion or black matrix portion by irradiating the portion with a laser via a plurality of small photomasks for pixel formation such that the cumulative exposure amount is 1 to 150 mJ/cm$^2$, the step of removing an unexposed portion of the photosensitive resin layer by development, and the step of thermosetting the developed photosensitive resin layer, thereby forming a black matrix and filter segments.

The technique of the present invention can form the pattern of active matrix elements such as TFTs by using a positive photosensitive resin based on a novolak resin as a resist pattern. Alternatively, the technique of the present invention is applicable to a technique called COA that forms a color filter on a substrate on which TFT elements are formed. By adjusting the exposure amount by changing the number of shots or by adjusting the laser irradiation angle, it is possible to form an alignment film pattern in which the liquid crystal molecular alignment is adjustable, or phase-difference patterns of differing retardation.

A color filter manufactured by the color filter manufacturing method of the present invention includes filter segments and a black matrix on a transparent substrate. The filter segments can have at least two colors selected from the group consisting of red, green, blue, yellow, orange, and cyan. When manufacturing a liquid crystal color filter, a transparent conductive layer and alignment film layer are further sequentially stacked. For example, a liquid crystal display device is manufactured by opposing the color filter to a counter substrate on which electrodes such as thin film transistors (TFTs) are formed, with a liquid crystal layer being interposed between them. In the following description, the color filter includes a transparent substrate, a black matrix, and coloring pixel layers of red, green, and blue. It is possible to form a planarizing layer, protective layer, and transparent conductive layer on the color filter as needed.

As the substrate of the color filter, it is possible to use a known transparent substrate material such as a glass substrate, quartz substrate, or plastic substrate. Among these substrates, the glass substrate is superior in transparency, strength, heat resistance, and weather resistance. As described previously, a color filter can also be formed on a substrate on which active elements such as TFTs for driving a liquid crystal are preformed.

[Photosensitive Resin Composition Coating Step]

In the photosensitive resin composition coating step, a substrate is evenly coated by using a known coating apparatus such as a slit die coater or spin coater. After that, a low-pressure drying process or prebaking process can be performed as needed in order to remove the solvent component. As the photosensitive resin composition for use in the color filter, a negative photosensitive resin formed by dispersing an organic pigment as a colorant in an acrylic resin as a base may be used. The pattern of active elements such as TFTs for driving a liquid crystal is formed by using a positive photosensitive resin based on a novolak resin.

[Exposure Step]

In the exposure step, a prospective filter segment or black matrix portion of the above-mentioned photosensitive resin layer is cured or exposed by irradiation with a laser. More specifically, the photosensitive resin layer formed on a large-sized substrate is cured or exposed by irradiating the layer with a laser via photomasks smaller than the substrate.

As shown in FIG. 1, a plurality of small photomasks 10 are arranged along the widthwise direction of a large rectangular substrate 20 coated with the photosensitive resin layer. In addition, laser sources (not shown) are arranged in one-to-one correspondence with the photomasks 10. The use of the plurality of photomasks 10 can prevent the decrease in throughput caused by laser exposure. The number of small photomasks 10 can be decreased by arranging them in the widthwise direction of the rectangular substrate 20. Therefore, the rectangular substrate 20 is fed in the longitudinal direction during exposure. To reduce the connection unevenness of a large screen, the small photomasks 10 may be arranged in a plurality of rows, instead of one row, in the widthwise direction of a large substrate. More specifically, a plurality of small photomasks 10 are arranged in a row along the widthwise direction of the substrate 20, and another row is formed in the widthwise direction so as to be shifted by one mask from the former row.

Also, to reduce the connection unevenness of a large screen, it is favorable to randomize, on the order of a few microns or submicrons, the dimension or array of the same pattern formed in the small photomask 10. Likewise, the positions of the small photomasks may finely be adjusted at random during exposure. Note that regions 21 bounded by the broken lines in FIG. 1 are exposure regions equivalent to four liquid crystal panels. In this example, four liquid crystal panels are formed from the rectangular substrate 20.

A general photomask has a frame-like, non-effective portion around an effective pattern as an opening for exposure. As described above, a plurality of small photomasks 10 for use in the present invention are arranged in the widthwise direction of the rectangular substrate as an exposure target. To eliminate an unexposed pattern formed by the non-effective portion, however, it is preferable to arrange two rows or three or more rows of the photomasks 10 as they are staggered as shown in FIG. 1. This makes it possible to ensure a throughput higher than that when performing stepper exposure by moving the small photomask itself.

An alignment film pattern having four alignment regions can be formed by arranging two sets of two small photomask rows. When forming the alignment film pattern, the small photomask or its opening may be inclined, e.g., 45° together with the laser source with respect to the feeding direction of the rectangular substrate. The incident angle of the laser to the surface of the photosensitive resin layer on the rectangular substrate can be, e.g., 20° to 70°.

The structure of the photomask will be explained in more detail below with reference to a sectional view of FIG. 2A and a plan view of FIG. 2B. The photomask 10 is manufactured by forming a light-shielding film 12 on the lower surface of a transparent substrate 11, and forming opening patterns in the light-shielding film 12. When a laser is emitted from the upper surface side of the transparent substrate 11 via a blind shutter 15, light transmitted through the opening patterns is transferred. Note that reference numerals 13a and 13b in FIG. 2B indicate different types of patterns; and 14, a laser irradiation region on the mask.

In the small photomask 10 of the present invention, different types of patterns are preferably formed in the feeding direction of the rectangular substrate. For example, as shown in FIGS. 2A and 2B, a CF-a pattern 13a and CF-b pattern 13b having different color filter types may be formed. Furthermore, the number of types is not limited to two, and three or more types can also be formed. One of the CF-a pattern 13a and CF-b pattern 13b different in filter segment width and size can be produced by covering the other with the blind shutter 15 so as not to expose the other pattern. That is, each type can selectively be exposed. This technique extremely decreases the number of times of a type switching operation, and effectively obviates the need to manufacture a new photomask for each type.

When forming alignment film patterns, a desired aligning process can be performed by performing exposure by changing the laser irradiation angle in the direction perpendicular to the rectangular substrate or in the widthwise direction of the rectangular substrate. In the formation of alignment film patterns, a liquid crystal cell encapsulating a liquid crystal can be processed as a rectangular substrate, and laser irradiation can be performed in an electric field or magnetic field environment.

As the laser, it is possible to use a known laser such as a semiconductor laser, YAG (solid) laser, or gas laser (argon laser, helium neon laser, carbonic acid gas laser, or excimer laser). A YAG laser having an oscillation wavelength of 343 or 355 nm can preferably be used. When forming alignment film patterns or phase-difference patterns, an LED light source or short arc lamp can also be used to compensate for the wavelength region of insufficient light. The laser beam can be unpolarized, and can also be polarized via a polarizer.

Among them all, it is favorable to use the excimer laser that emits a laser beam by using a gas mixture of a rare gas such as argon, krypton, or xenon and a halogen gas such as fluorine or bromine. The excimer laser changes its oscillation wavelength in accordance with a combination of the types of the gas mixture. Examples are 193 nm (ArF), 248 nm (KrF), 308 nm (XeCL), and 351 nm (XeF). The excimer laser has a pulse width of a few ten ns, has a beam section reflecting the shape of a discharge region, and oscillates an oblong beam at a high output. Some apparatuses can emit a thick beam with a pulse energy of up to a few thousand mJ. The excimer laser is suited to the batch processing of a relatively large area performed by a high irradiation intensity, rather than processing in which the beam is concentrated to one point.

An optical system for expanding the laser beam into the shape of a slit is preferably an optical lens system called an expander. A method using a rotary member such as a polygon mirror is unfavorable because light interference is reported on the surface of the photosensitive resin layer during exposure. It is favorable to use a fly-eye lens as a microlens set together.

The coloring coating film must be cured or exposed by application of an appropriate energy that does not decompose the film. If the laser beam irradiation intensity is too low, it takes a long time to sufficiently photocure or expose the film, and the productivity (tact) decreases. On the other hand, if the laser beam irradiation intensity is too high, the film reduces owing to resin decomposition called abrasion or the diffusion of the resist component. The energy density per pulse of the laser for use in the present invention is preferably 0.1 mJ/cm$^2$ (inclusive) to 1,000 mJ/cm$^2$ (inclusive).

To sufficiently cure the resist coating film, the energy density is more preferably 0.3 mJ/cm$^2$ or more, and most preferably, 1 mJ/cm$^2$ or more. Furthermore, to prevent the reduction of the coloring coating film as the photosensitive resin layer caused by abrasion, the energy density is more preferably 150 mJ/cm$^2$ or less, and most preferably, 50 mJ/cm$^2$ or less. The energy density is particularly favorably 1 to 50 mJ/cm$^2$ from the viewpoint of the relationship between the laser beam irradiation intensity, the throughput, and the sensitivity of the photosensitive resin layer.

The pulse width is preferably 0.1 nsec (inclusive) to 3,000 nsec (inclusive). To prevent the decomposition of the coloring coating film caused by the abrasion phenomenon, the pulse width is more preferably 0.5 nsec or more, and most preferably, 1 nsec or more. To prevent the thickening of patterns and increase the pattern alignment accuracy in laser scan exposure, the pulse width is more preferably 1,000 nsec or less, and most preferably, 50 nsec or less. The pulse width is particularly favorably 1 to 50 nsec from the viewpoint of the relationship between the substrate feeding speed and the laser beam irradiation intensity.

In the technique of the present invention, the mask opening width, the laser oscillation frequency, the number of times of irradiation (the number of shots) for obtaining the necessary exposure amount, and the irradiation density are important elements for assuring a high productivity.

Assuming that the opening width of the small photomask in the direction of the rectangular substrate as an exposure target is "the mask opening width", and the number of times of repetitive laser exposure to the same filter segment is "the number of shots", the exposure rate (related to the feeding speed of the rectangular substrate) as an index of the productivity is represented by Exposure rate=(mask opening width×oscillation frequency)/number of shots Also, the number of filter segments that can be shot by the above-mentioned "number of shots" as a unit, i.e., "the number of shot pixels" is an integer represented by the following expression. That is, in the present invention, the number of filter segments that can be shot by "the number of shots" as a unit is an integer from two to twenty pixels in the moving direction of the rectangular substrate.

Number of shot pixels≤mask opening width/(number of shots×pixel pitch)

Furthermore, the laser oscillation frequency is preferably 1 Hz (inclusive) to 5,000 Hz (inclusive). The oscillation frequency is more preferably 10 Hz or more in order to shorten the exposure time, and most preferably 30 Hz or more in the exposure of the coloring photosensitive resin composition. To increase the alignment accuracy in scan exposure, the oscillation frequency is more preferably 500 Hz or less. To facilitate the synchronization with the feeding of the substrate while ensuring a high accuracy, the oscillation frequency is particularly favorably 30 to 500 Hz.

In the present invention, the photosensitive resin layer made of the photosensitive resin composition can divisionally be irradiated with the laser a plurality of number of times. To suppress the abrasion phenomenon, it is effective to decrease the laser pulse energy and repeat irradiation a plurality of number of times. The cumulative exposure amount is preferably 1 to 150 mJ/cm$^2$, and most preferably, 1 to 50 mJ/cm$^2$. If the cumulative exposure amount exceeds 150 mJ/cm$^2$, the decomposition of the coloring coating film as the photosensitive resin layer progresses owing to the abrasion phenomenon, and this makes it impossible to finally obtain filter segments or a black matrix having a sufficient film thickness. On the other hand, if the photosensitive resin composition well matches the coloring composition, filter segments can be formed as a color filter with a minimum cumulative exposure amount of 1 mJ/cm$^2$.

For the purpose of forming spacers having different heights in order to regulate the liquid crystal cell gap, performing exposure by changing the number of shots from the laser source is a simple means having a high degree of freedom. The number of shots (exposure amount) of structures different in height and size is as follows. For example, a gentle linearity can be given to the number of shots (exposure amount) and the structure height within the range of 10 to 40 mJ/cm$^2$. In other words, structures different in height can be formed in accordance with the number of shots.

[Developing Step]

When processing a negative photosensitive resin layer such as the coloring coating film in the developing step, the conventionally known developing method is used to remove unexposed portions of the photosensitive resin layer, thereby forming filter segments or a black matrix. When removing the unexposed portions, an aqueous solution such as sodium carbonate or sodium hydroxide is used as an alkali developer, and it is also possible to use an organic alkali such as dimethylbenzylamine or triethanolamine. An anti-foaming agent or surfactant can also be added to the developer. As the developing method, it is possible to apply, e.g., shower development, spray development, dipping development, or puddle development. When processing a positive photosensitive resin such as a novolak resin, positive patterns are formed by removing the exposed photosensitive resin layer by an alkali developer, thereby obtaining a patterned substrate.

[Sintering Step]

The present invention includes a film hardening step of hardening the formed filter segments or black matrix by annealing. The method of annealing is not particularly limited, and it is possible to use, e.g., heating by a convection oven, hot plate, halogen heater, or IR oven. As the sintering conditions, heating is preferably performed at 200° C. to 250° C. for 10 to 60 min.

[Photosensitive Resin Composition]

The photosensitive resin composition usable in the present invention will now be explained. The photosensitive resin composition usable in the present invention desirably has a heat resistance required in the liquid crystal panel formation step. Also, the photosensitive resin composition is not limited, and need only be a photosensitive resin material that can be processed by pattern development in the developing step using an alkali as a post-process. An example is a photosensitive resin composition containing an organic pigment as a coloring photosensitive resin composition, a monomer having an ethylenically unsaturated double bond, and a photopolymerization initiator, and curable by laser irradiation. As a photosensitive resin composition for forming spacers and ribs for regulating the liquid crystal cell gap and liquid crystal alignment, for alignment control, and for forming projections, a photosensitive resin composition based on an acrylic resin can be used. A negative photosensitive resin composition and positive photosensitive resin composition can selectively be used in accordance with the purpose.

In addition to the above-mentioned resins, it is possible to apply an organic resin to the present invention. Examples are polyimide, polysulfone, polyester, polyamide, polycarbonate, poly(meth)acrylate, polyphenylene sulfide, polyphenylene oxide, and norbornene.

The material for use in the alignment film patterns need not be limited. As an alignment film material, it is possible to use a photo-alignable polymer containing polyamic acid, polyimide, polyamic acid ester, polystyrene, a styrene-phenylmaleimide copolymer, or poly(meth)acrylate as a skeleton, and a photosensitive group or alignable group on the main chain or side chain of the skeleton. Similarly, the material for use in phase-difference patterns need not be specified, and examples are a photosensitive bar-like polymerizable liquid crystal compound and photosensitive discotic polymerizable compound.

[Pigment]

As the pigment contained in the coloring photosensitive resin composition, a commercially available organic pigment can be used, and a dye, natural dyestuff, and inorganic pigment can be used together in accordance with the color of a filter segment to be formed. As the organic pigment, it is particularly favorable to use a pigment having high color generation properties and a high heat resistance, particularly, a high thermal decomposition resistance. It is possible to use one organic pigment alone, or two or more types of organic pigments as a mixture. The organic pigment may be refined by, e.g., salt milling or acid pasting.

The coloring photosensitive resin composition can contain an inorganic pigment in order to secure high coating properties, high sensitivity, and high development properties while balancing the saturation and lightness. Examples of the inorganic pigment are titanium oxide, barium sulfate, zinc oxide, lead sulfate, chrome yellow, zinc chromate, Bengala (red iron (III) oxide), cadmium red, ultramarine, Prussian blue, chromium oxide green, cobalt green, amber, titanium black, synthetic iron black, and carbon black. It is possible to use one inorganic pigment alone, or two or more types of inorganic pigments as a mixture. The inorganic pigment can be used in an amount of 0.1 to 10 mass % with respect to the total mass (100 mass %) of the pigments.

In addition, the photosensitive resin composition for use in the present invention can contain a dye as long as the heat resistance does not decrease, in order to control the color. The dye can be used in an amount of 0.1 to 1.0 mass % with respect to the total mass (100 mass %) of the pigments.

[Monomer Having Ethylenically Unsaturated Double Bond]

The monomer having an ethylenically unsaturated double bond is a component to be cured by irradiation with a laser. Examples of the monomer having an ethylenically unsaturated double bond are various acrylic esters and methacrylic esters such as 2-hydroxyethyl(meth)acrylate, 2-hydroxypropyl(meth)acrylate, cyclohexyl(meth)acrylate, polyethyleneglycoldi(meth)acrylate, pentaerythritoltri(meth)acrylate, trimethylolpropanetri(meth)acrylate, dipentaerythritolhexa(meth)acrylate, tricyclodecanyl(meth)acrylate, melamine (meth)acrylate, and epoxy(meth)acrylate, (meth)acrylic acid, styrene, vinyl acetate, (meth)acrylamide, N-hydroxymethyl(meth)acrylamide, and acrylonitrile.

To increase the sensitivity of the coloring composition, the monomer having an ethylenically unsaturated double bond preferably has four to twelve ethylenically unsaturated double bonds. It is possible to use one monomer having an ethylenically unsaturated double bond, or two or more types of monomers each having an ethylenically unsaturated double bond as a mixture. The content of the monomer having an ethylenically unsaturated double bond is preferably 10 to 300 parts by mass, and more preferably, 10 to 200 parts by mass with respect to 100 parts by mass of the pigment.

[Photopolymerization Initiator]

The photopolymerization initiator is preferably a material whose molar absorption coefficient ($\epsilon 308$) at 308 nm is larger than the molar absorption coefficient ($\epsilon 365$) at 365 nm. The molar absorption coefficient herein mentioned is a value obtained by diluting the photopolymerization initiator to about $1.0 \times 10^{-5}$ mol/mL by acetonitrile, and converting the absorption spectrum at the wavelength by the molar concentration.

As the photopolymerization initiator, it is possible to use, e.g., an acetophenone-based photopolymerization initiator, benzoin-based photopolymerization initiator, benzophenone-based photopolymerization initiator, thioxanthone-based photopolymerization initiator, triazine-based photopolymerization initiator, borate-based photopolymerization initiator, carbazole-based photopolymerization initiator, or imidazole-based photopolymerization initiator. It is possible to use one photopolymerization initiator alone, or two or more types of photopolymerization initiators as a mixture. The content of the photopolymerization initiator can be 5 to 200 parts by mass, and preferably, 10 to 150 parts by mass with respect to 100 parts by mass of the pigment.

Note that examples of the acetophenone-based photopolymerization initiator are 4-phenoxydichloroacetophenone, 4-t-butyl-dichloroacetophenone, diethoxyacetophenone, 1-(4-isopropylphenyl)-2-hydroxy-2-methylpropane-1-one, 1-hydroxycyclohexylphenylketone, 2-methyl-[4-(methylthio)phenyl]-2-morpholinopropane-1-one, and 2-benzyl-2-dimethylamino-1-(4-morpholinophenyl)-butane-1-one.

Examples of the benzoin-based photopolymerization initiator are benzoin, benzoinmethylether, benzomethylether, benzoinisopropylether, and benzyldimethylketal.

Examples of the benzophenone-based photopolymerization initiator are benzophenone, benzoylbenzoic acid, methylbenzoylbenzoate, 4-phenylbenzophenone, hydroxybenzophenone, acrylated benzophenone, and 4-benzoyl-4'-methyldiphenylsulfide.

Examples of the thioxanthone-based photopolymerization initiator are thioxanthone, 2-chlorothioxantone, 2-methylthioxantone, isopropylthioxanthone, and 2,4-diisopropylthioxantone.

Examples of the triazine-based photopolymerization initiator are 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-piperonyl-4,6-bis(trichloromethyl)-s-triazine, 2,4-bis(trichloromethyl)-6-styryl-s-triazine, 2-(naphtho-1-yl)-4,6-bis(trichloromethyl)-s-triazine, 2-(4-methoxy-naphtho-1-yl)-4,6-bis(trichloromethyl)-s-triazine, 2,4-trichloromethyl-(piperonyl)-6-triazine, and 2,4-trichloromethyl(4'-methoxystyryl)-6-triazine.

The ratio (I/M) of the mass (I) of the photopolymerization initiator to the mass (M) of the monomer having an ethylenically unsaturated double bond is preferably 0.01 to 0.45. To reduce the cost by reducing the photopolymerization initiator, the ratio (I/M) is preferably as low as possible, and more preferably, 0.30 or less. However, it becomes difficult to achieve the basic function of the photopolymerization initiator if the ratio (I/M) is less than 0.01.

The photosensitive resin composition for use in the present invention basically requires no sensitizer, but it is also possible to use the photopolymerization initiator and a sensitizer together. It is possible to use one sensitizer alone, or two or more types of sensitizers as a mixture. The content of the sensitizer is preferably 0.1 to 6.0 parts by mass with respect to 100 parts by mass of the photopolymerization initiator.

The photosensitive resin composition for use in the present invention can further contain polyfunctional thiol that functions as a chain transfer agent. It is possible to use one polyfunctional thiol alone, or two or more types of polyfunctional thiols as a mixture. The content of the polyfunctional thiol is preferably 0.05 to 100 parts by mass, and more preferably, 0.1 to 60 parts by mass with respect to 100 parts by mass of the pigment.

The photosensitive resin composition for use in the present invention can contain a storage stabilizer in order to stabilize the viscosity with time of the composition. The photosensitive resin composition can also contain an adhesion improving agent such as a silane coupling agent in order to increase the adhesion with the transparent substrate. The storage stabilizer can be used in an amount of 0.1 to 10 parts by mass with respect to 100 parts by mass of the pigment in the photosensitive resin composition.

The photosensitive resin composition for use in the present invention can contain a transparent resin in order to increase the dispersibility of the pigment and the adhesion to the coating base. The transparent resin is a resin having a transmittance of preferably 80% or more, and more preferably, 95% or more in the total wavelength region of a visible light region of 400 to 700 nm. The transparent resin includes a thermoplastic resin, thermosetting resin, and photosensitive resin, and it is possible to use any of these resins alone, or two or more types of the resins as a mixture.

As the photosensitive transparent resin, a resin having an ethylenically unsaturated double bond can be used. An example is a resin obtained by causing a (meth)acrylic compound or cinnamic acid having a reactive substituent group such as an isocyanate group, aldehyde group, epoxy group, or carboxyl group to react with a polymer having a reactive substituent group such as a hydroxyl group, carboxyl group, or amino group, thereby introducing a functional group having an ethylenically unsaturated double bond such as a (meth) acryloyl group or styryl group to the polymer.

A practical example is a resin obtained by causing a compound having a functional group capable of reacting with a hydroxyl group and an ethylenically unsaturated double bond to react with a copolymer formed by copolymerizing an ethylenically unsaturated monomer having a hydroxyl group and another ethylenically unsaturated monomer. Examples of the functional group capable of reacting with a hydroxyl group are an isocyanate group and carboxyl group, and an isocyanate group is particularly preferable in respect of the reactivity. Practical examples of the isocyanate group and the compound having an ethylenically unsaturated double bond are 2-acryloylethylisocyanate and 2-methacryloylethylisocyanate. It is also possible to use a resin obtained by half-esterifying a polymer containing an acid anhydride, such as a styrene-maleic anhydride copolymer or α-olefin-maleic anhydride copolymer, by a (meth)acrylic compound having a hydroxyl group such as hydroxylalkyl(meth)acrylate.

The photosensitive resin composition of the present invention can contain a solvent in order to sufficiently disperse the pigment in the composition, and coat the transparent substrate such as a glass substrate with the composition such that the dry film thickness is 0.2 to 5 μm, thereby facilitating the formation of filter segments. It is possible to use one solvent alone or a mixture of solvents.

When dispersing the pigment in the monomer having an ethylenically unsaturated double bond, it is possible to appropriately use a dispersant such as a surfactant, resin type pigment dispersant, or dyestuff derivative. The dispersant has a high pigment dispersibility, and has a large effect of preventing the reaggregation of the dispersed pigment. Therefore, a highly transparent color filter is obtained when using a photosensitive resin composition formed by dispersing the pigment in the transparent resin and organic solvent by using the dispersant. The pigment dispersant can be used in an amount of 0.1 to 40 parts by mass, and preferably, 0.1 to 30 parts by mass with respect to 100 parts by mass of the pigment in the photosensitive resin composition.

EXAMPLES

Practical examples of the present invention and comparative examples will be explained below. Note that in the examples and comparative examples, "parts" and "%" respectively mean "parts by mass" and "mass %".

First, the preparation of an acrylic resin solution and pigment dispersion used in the examples and comparative examples will be explained. The molecular weight of a resin is the mass-average molecular weight of polystyrene measured by GPC (Gel Permeation Chromatography).

[Synthesis Example of Acrylic Resin Solution]

370 parts of cyclohexane were placed in a reaction vessel, and the reaction vessel was heated to 80° C. while nitrogen gas was supplied into the vessel. At the same temperature, a mixture containing 20.0 parts of methacrylic acid, 10.0 parts of methylmethacrylate, 55.0 parts of n-butylmethacrylate, 15.0 parts of 2-hydroxyethylmethacrylate, and 4.0 parts of 2,2'-azobisisobutyronitrile was dropped over 1 hr, thereby performing a polymerization reaction. After the dropping was complete, the reaction was continued at 80° C. for 3 hrs, a solution prepared by dissolving 1.0 part of azobisisobutyronitrile in 50 parts of cyclohexanone was added, and the reaction was further continued at 80° C. for 1 hr, thereby obtaining an acrylic resin copolymer solution. After the reaction vessel was cooled to room temperature, about 2 g of the acrylic resin solution was sampled and dried by heating at 180° C. for 20 min, and the nonvolatile content was measured. Cyclohexane was added to the previously synthesized acrylic resin solution such that the nonvolatile content was 20 mass %, thereby preparing an acrylic resin solution. A mass-average molecular weight Mw of the obtained acrylic resin was 40,000.

[Preparation of Pigment Dispersions]

Mixtures having compositions shown in (Table 1) were each uniformly mixed by stirring, and dispersed by a sand mill for 5 hrs by using glass beads having a diameter of 1 mm. After that, the dispersions were filtered through a 5-μm filter, thereby preparing a red pigment dispersion R-1, green pigment dispersion G-1, blue pigment dispersion B-1, and black pigment dispersion BM-1. Note that the materials described in (Table 1) are as follows.

PR254: Diketopyrrolopyrrole-based pigment
 (C. I. Pigment Red 254)
 ("Irgafor Red B-CF" available from Ciba Japan)
PR177: Anthraquinone-based pigment
 (C. I. Pigment Red 177)
 ("Chromophthal Red A2B" available from Ciba Japan)
PG36: Halogenated copper phthalocyanine-based pigment
 (C. I. Pigment Green 36)
 ("Lionol Green 6YK" available from Toyo Ink)
PB15:6: ε-type copper phthalocyanine pigment
 (C. I. Pigment Blue 15:6)
 ("Heliogen Blue L-6700F" available from BASF)
PY150: Nickel azo complex-based pigment
 (C. I. Pigment Yellow 150)
 ("E4GN" available from LANXESS)
CB: Carbon black
 (C. I. Pigment Black 7)
 ("MA11" available from Mitsubishi Chemical)
Pigment dispersant: "Solsperse 20000" available from Lubrizol
Acrylic resin solution: Previously prepared acrylic resin solution
Solvent: Cyclohexane

TABLE 1

|  | Pigment dispersion R-1 | Pigment dispersion G-1 | Pigment dispersion B-1 | Pigment dispersion BM-1 |
| --- | --- | --- | --- | --- |
| PR254 | 9.95 | — | — | — |
| PR177 | 1.58 | — | — | — |
| PG36 | — | 7.82 | — | — |
| PB15:6 | — | — | 12 | — |
| PY150 | 0.47 | 4.18 | — | — |
| CB | — | — | — | 12 |
| Pigment dispersant | 24 | 2.4 | 2.4 | 2.4 |
| Acrylic resin solution | 25.6 | 25.6 | 25.6 | 25.6 |
| Organic solvent | 60 | 60 | 60 | 60 |
| Total | 100 | 100 | 100 | 100 |

[Preparation of Coloring Compositions (Resists)]

Mixtures having compositions shown in (Table 2) were each uniformly mixed by stirring by using the previously prepared pigment dispersions R-1, G-1, B-1, and BM-1. After that, the mixtures were filtered through a 1-μm filter, thereby obtaining coloring compositions (resists) RED-1 (R1), GREEN (G1), BLUE, BM (BM1), RED-2 (R2), and RED-3 (R3) of the photosensitive resin compositions.

TABLE 2

|  | Resist | RED-1 | GREEN | BLUE | BM | RED-2 | RED-3 |
|---|---|---|---|---|---|---|---|
| Pigment dispersion (type) | | R-1 | G-1 | B-1 | BM-1 | R-1 | R-1 |
| Composition | Pigment dispersion | 38.0 | 38.0 | 38.0 | 46.0 | 38.0 | 38.0 |
| | Acrylic resin solution | 14.0 | 14.0 | 14.0 | 5.0 | 14.0 | 14.0 |
| | Photopolymerization initiator | 1.30 | 1.30 | 1.30 | 1.80 | 0.65 | 0.06 |
| | Monomer | 4.50 | 4.50 | 4.50 | 4.00 | 5.15 | 5.74 |
| | Organic solvent | 42.2 | 42.2 | 42.2 | 43.2 | 42.2 | 42.2 |
| | Total | 100.0 | 100.0 | 100.0 | 100.0 | 100.0 | 100.0 |
| Photopolymerization initiator/monomer | | 0.29 | 0.29 | 0.29 | 0.45 | 0.13 | 0.01 |

The materials described in (Table 2) are as follows.

Pigment dispersion: Previously prepared pigment dispersion

Acrylic resin solution: Previously prepared acrylic resin solution

Monomer: Dipentaerythritolhexaacrylate ("Aronix M-402" available from TOAGOSEI)

Organic solvent: Cyclohexane (Table 3) shows the molar absorption coefficient ($\epsilon 308$) at 308 nm and the molar absorption coefficient ($\epsilon 365$) at 365 nm of each of photopolymerization initiators used in the photosensitive resin compositions used in the examples and comparative examples.

TABLE 3

| | Molar absorption coefficient ($\epsilon_{308}$) | Molar absorption coefficient ($\epsilon_{365}$) |
|---|---|---|
| Photopolymerization initiator 1 | $1.09 \times 10^4$ | $0.27 \times 10^4$ |
| Photopolymerization initiator 2 | $1.72 \times 10^4$ | $0.28 \times 10^4$ |
| Photopolymerization initiator 3 | $0.55 \times 10^4$ | $0.14 \times 10^4$ |
| Photopolymerization initiator 4 | $1.93 \times 10^4$ | $1.01 \times 10^4$ |
| Photopolymerization initiator 5 | $1.82 \times 10^4$ | $0.11 \times 10^4$ |
| Photopolymerization initiator 6 | $1.49 \times 10^4$ | $0.23 \times 10^4$ |
| Photopolymerization initiator 7 | $2.18 \times 10^4$ | $2.39 \times 10^4$ |

Photopolymerization initiators 1 to 7 are as follows.

Photopolymerization initiator 1: Carbazole-based photopolymerization initiator 3.6-bis(2-methyl-2-morpholinopropionyl)-9-n-octylcarbazole ("ADEKA ARKLS N-1414" available from ADEKA)

Photopolymerization initiator 2: Oxime ester-based photopolymerization initiator 1,2-octadion-1-[4-(phenylthio)-,2-(O-benzoyloxime)] ("Irgacure OXE-01" available from Ciba Specialty Chemicals)

Photopolymerization initiator 3: Oxime ester-based photopolymerization initiator ethanone, 1-[9-ethyl-6-(2-methylbenzoyl)-9H-carbazole-3-yl]-,1-(0-acetyloxime) ("Irgacure OXE-02" available from Ciba Specialty Chemicals)

Photopolymerization initiator 4: Acylphosphine oxide-based photopolymerization initiator 2,4,6-trimethylbenzoyl-diphenylphosphine oxide ("Lucirin TPO" available from BASF)-Photopolymerization initiator 5: α-Aminoalkylphenone-based photopolymerization initiator 2-methyl-1-[4-(methylthio)phenyl]-2-morpholinopropane-1-one ("Irgacure 907" available from Ciba Specialty Chemicals)

Photopolymerization initiator 6: α-aminoalkylphenone-based photopolymerization initiator 2-(dimethylamino)-2-[(4-methylphenyl)methyl]-1-[4-(4-morpholinyl)phenyl]-1-butanone ("Irgacure 379" available from Ciba Specialty Chemicals)

Photopolymerization initiator 7: Triazine-based photopolymerization initiator 9H-carbazole-9-acetic acid-3-[4,6-bis(trichloromethyl)-1,3,5-triazine-2-yl]-2-methoxy-1-methylethylester ("ADEKA ARKLS PZ-408" available from ADEKA)

Examples 1-19 & Comparative Examples 1-3

As Examples 1 to 19 and Comparative Examples 1 to 3, the obtained coloring compositions (resists) RED-1 (R1) (red), GREEN (G1) (green), BLUE (B1) (blue), BM (BM1) (black), RED-2 (R2) (red), and RED-3 (R3) (red) of the photosensitive resin compositions, the photopolymerization initiators, the exposure amount, and the number of times of exposure were combined as shown in (Tables 4 to 6), thereby performing pattern formation of filter segments and a black matrix forming a color filter.

TABLE 4

| | Example 1 | Example 2 | Example 3 | Example 4 | Example 5 | Example 6 | Example 7 | Example 8 | Comparative Example 1 |
|---|---|---|---|---|---|---|---|---|---|
| Color | Red | Red | Red | Green | Blue | Black | Red | Red | Red |
| Resist | R1 | R2 | R3 | G1 | B1 | BM1 | R1 | R1 | R1 |
| Photopolymerization initiator | Initiator 1 | Initiator 1 | Initiator 1 | Initiator 1 | Initiator 1 | Initiator 1 | Initiator 1 | Initiator 1 | Initiator 1 |
| First-time exposure amount (mJ/cm$^2$) | 40 | 40 | 40 | 40 | 40 | 40 | 4 | 80 | 160 |
| Second-time exposure amount (mJ/cm$^2$) | — | — | — | — | — | — | — | — | — |
| Linearity | ○ | ○ | ○ | ○ | ○ | ○ | ○ | Δ | XX |
| Sectional shape | ○ | ○ | ○ | ○ | ○ | ○ | ○ | ○ | XX |
| Film reduction ratio | ○ | ○ | ○ | ○ | ○ | ○ | ○ | Δ | X |

TABLE 5

|  | Example 1 | Example 6 | Comparative Example 1 | Example 9 | Example 10 | Example 11 | Example 12 | Example 13 | Comparative Example 2 |
|---|---|---|---|---|---|---|---|---|---|
| Color | Red | Red | Red | Red | Green | Blue | Black | Red | Red |
| Resist | R1 | R1 | R1 | R1 | G1 | B1 | BM1 | R1 | R1 |
| Photopolymerization initiator | Initiator 1 | Initiator 1 | Initiator 1 | Initiator 1 | Initiator 1 | Initiator 1 | Initiator 1 | Initiator 1 | Initiator 1 |
| First-time exposure amount (mJ/cm$^2$) | 40 | 80 | 160 | 20 | 20 | 20 | 20 | 40 | 80 |
| Second-time exposure amount (mJ/cm$^2$) | — | — | — | 20 | 20 | 20 | 20 | 40 | 80 |
| Linearity | ○ | Δ | XX | ○ | ○ | ○ | ○ | ○ | X |
| Sectional shape | ○ | ○ | XX | ○ | ○ | ○ | ○ | ○ | X |
| Film reduction ratio | ○ | Δ | X | ◎ | ◎ | ◎ | ◎ | ○ | Δ |

TABLE 6

|  | Example 1 | Example 4 | Example 5 | Example 6 | Example 14 | Example 15 | Example 16 | Example 17 | Example 18 | Example 19 |
|---|---|---|---|---|---|---|---|---|---|---|
| Color | Red | Green | Blue | Black | Red | Red | Red | Red | Red | Red |
| Resist | R1 | G1 | B1 | BM1 | R1 | R1 | R1 | R1 | R1 | R1 |
| Photopolymerization initiator | Initiator 1 | Initiator 1 | Initiator 1 | Initiator 1 | Initiator 2 | Initiator 3 | Initiator 4 | Initiator 5 | Initiator 6 | Initiator 7 |
| First-time exposure amount (mJ/cm$^2$) | 40 | 40 | 40 | 40 | 40 | 40 | 40 | 40 | 40 | 40 |
| Second-time exposure amount (mJ/cm$^2$) | — | — | — | — | — | — | — | — | — | — |
| Linearity | ○ | ○ | ○ | ○ | ○ | ○ | ○ | ○ | ○ | Δ |
| Sectional shape | ○ | ○ | ○ | ○ | ○ | ○ | ○ | ○ | ○ | ○ |
| Film reduction ratio | ○ | ○ | ○ | ○ | ○ | ○ | ○ | ○ | ○ | Δ |

[Pattern Formation of Filter Segments and Black Matrix]

A 10×10-cm glass substrate was coated with each coloring composition (resist) about 2.5 μm thick by a spin coater, and left to stand in an oven at 70° C. for 15 min, thereby removing the excess solvent by drying. Then, a 100-μm striped photomask for filter segments and a 200-μm striped photomask for a black matrix were set at a distance of 150 μm from the coloring composition coating film. In this state, an excimer laser having a wavelength of 308 nm (XeCL) was emitted at a pulse width of 20 nsec and a frequency of 600 Hz, by an exposure amount shown in Tables (4 to 6). Subsequently, unexposed portions were removed by development, and the substrate was heated at 230° C. for 30 min, thereby forming individual color filter segments (red, green, and blue) and a black matrix (black). Note that "LAMBADA SX200C" manufactured by COHERENT was used as the excimer laser apparatus, and the exposure amount was measured using "3SIGMA (main body) J25LP-MUV (sensor head)" manufactured by COHERENT.

[Shape Evaluation]

The filter segments and black matrices of the color filters manufactured in the above-mentioned examples and comparative examples were observed, and the pattern shapes were evaluated by four grades. More specifically, (1) the linearity was observed using an optical microscope, and (2) the sectional shape was observed using a scanning electron microscope (SEM). The evaluation criteria were as follows. (Tables 4 to 6) show the evaluation results.

(1) Linearity
○: the linearity was high
Δ: the linearity was partially low
x: the linearity was low
xx: almost no pixels were formed (2) Sectional Shape
○: a normally tapered shape (the section was trapezoidal, and the exposed surface was small)
Δ: an inversely tapered shape (the section was trapezoidal, and the exposed surface was large)
x: pixels were formed, but the shape was difficult to determine
xx: almost no pixels were formed

[Film Reduction Ratio Evaluation]

A substrate was coated with each coloring composition of the photosensitive resin composition, and the film thickness after the excess solvent was removed by low-pressure drying and the film thickness after the developed substrate was heated at 230° C. for 30 min were measured. The film reduction ratio was calculated from the following equation, and evaluated by four grades. Tables (4 to 6) show the evaluation results.

The evaluation criteria were as follows. (◎: the film reduction ratio was less than 20%, ○: the film reduction ratio was 20% (inclusive) to 30% (exclusive), Δ: the film reduction ratio was 30% (inclusive) to 50% (exclusive), and x: the film reduction ratio was 50% or more)

Film reduction ratio(%)=[(film thickness after coating and low-pressure drying−film thickness after heating at 230° C. for 20 min)/film thickness after coating and low-pressure drying]×100

<Comparison Results>
(Relationship Between Exposure Amount and Color Filter Quality)

As shown in (Table 4), in Examples 1 to 6, the formulations and exposure conditions well matched, and the evaluation results of the linearity, sectional shape, and film reduction ratio of all of the red, green, and blue filter segments and the black matrix were good.

In Example 7, the formulations and exposure conditions well matched, and the evaluation results of the linearity, sectional shape, and film reduction ratio of the red filter segment were good.

In Example 8, the excimer laser exposure amount was larger than those of Examples 1 to 7, so the linearity was partially low, and the film reduction ratio slightly increased, but they were on a practically usable level.

In Comparative Example 1, the excimer laser exposure amount was large, so the coating film was destroyed by irradiation with the excimer laser. Consequently, almost no filter segments were formed.

(Effect of Performing Exposure More than Once)

As shown in (Table 5), each of Examples 9 to 12 is an example in which exposure was divisionally performed twice. For all of the red, green, and blue filter segments and the black matrix, the film reduction ratio was lower than that when exposure was performed once, and good results were obtained for the linearity and sectional shape.

In Example 13, the cumulative exposure amount of the excimer laser was the same as that of Example 6. Since exposure was divisionally performed twice, the evaluation results of the linearity, sectional shape, and film reduction ratio of the red filter segment were good.

In Comparative Example 2, the excimer laser exposure amount emitted at a time was the same as that of Example 6. Since the cumulative exposure amount was large, however, the coating film was destroyed as it was irradiated with the excimer laser twice, resulting in a low linearity and a high film reduction ratio.

(Effect of Initiator Type and Color Filter Quality)

As shown in (Table 6), Examples 1 and 14 to 18 are examples performed by changing the type of photopolymerization initiator whose molar absorption coefficient ($\epsilon 308$) at 308 nm was larger than the molar absorption coefficient ($\epsilon 365$) at 365 nm. The evaluation results of the linearity, sectional shape, and film reduction ratio of the red filter segment were good.

In Example 19, photopolymerization initiator 7 whose molar absorption coefficient ($\epsilon 308$) at 308 nm was smaller than the molar absorption coefficient ($\epsilon 365$) at 365 nm was used. The linearity was partially low, and the film reduction ratio slightly increased, but they were on a practically usable level.

What is claimed is:

1. A color filter manufacturing method for forming a filter segment and a black matrix by repeating at least:
    coating a substrate with a photosensitive resin layer made of a photosensitive resin composition;
    curing the photosensitive resin layer on the substrate by pattern exposure;
    removing an unexposed (uncured) portion of the photosensitive resin layer by development of the photosensitive resin layer; and
    thermosetting the developed photosensitive resin layer,
    in this order a plurality of number of times,
    wherein in the curing, a laser is used as a light source, a plurality of photomasks arranged along the widthwise direction of the substrate and each having a pattern region smaller than a whole exposure region on the substrate are used as photomasks for pixel formation, the substrate is fed in a longitudinal direction of the substrate during exposure, and proximity exposure is performed by repetitively emitting the laser a plurality of number of times via the photomasks such that a cumulative exposure amount is 1 to 150 mJ/cm$^2$, and
    a dimension or array of a same pattern formed on the photomask is randomized on the order of a few microns or submicrons.

2. The color filter manufacturing method according to claim 1, wherein a frequency of the laser is 1 to 500 Hz.

3. The color filter manufacturing method according to claim 1, wherein an energy density per pulse of the laser is 0.1 to 1,000 mJ/cm$^2$, and a pulse width is 0.1 to 3,000 nsec.

4. The color filter manufacturing method according to claim 1, wherein in the curing, the photosensitive resin layer is photocured by emitting the laser such that the cumulative exposure amount is 1 to 50 mJ/cm$^2$.

5. The color filter manufacturing method according to claim 1, wherein a molar absorption coefficient ($\epsilon 308$) at 308 nm of a photopolymerization initiator used in the photosensitive resin composition is larger than a molar absorption coefficient ($\epsilon 365$) at 356 nm.

6. The color filter manufacturing method according to claim 1, wherein a ratio (I/M) of a mass (I) of a photopolymerization initiator to a mass (M) of a monomer used in the photosensitive resin composition is 0.01 to 0.45.

7. The color filter manufacturing method according to claim 1, wherein the pattern exposure is performed by changing an exposure amount by changing a number of shots of exposure from the laser.

* * * * *